(12) United States Patent
Yamano et al.

(10) Patent No.: US 7,378,732 B2
(45) Date of Patent: May 27, 2008

(54) SEMICONDUCTOR PACKAGE (75) Inventors: Takaharu Yamano, Nagano (JP);
Takako Yoshihara, Nagano (JP);
Masahiro Sunohara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 12 days.

(21) Appl. No.: 10/821,915

(22) Filed: Apr. 12, 2004

(65) Prior Publication Data
US 2004/0207082 A1 Oct. 21, 2004

(30) Foreign Application Priority Data
Apr. 15, 2003 (JP) .............. 2003-110680

(51) Int. Cl.
H01L 23/34 (2006.01)
H01L 23/02 (2006.01)

(52) U.S. Cl. .............. 257/713; 257/675; 257/686; 257/712

(58) Field of Classification Search .............. 257/661, 257/685, 686, 698, 699, 708, 712, 713, 723, 257/735, 737, 777, 778, 621, 675; 438/109, 438/777
See application file for complete search history.

(56) References Cited

U.S. PATENT DOCUMENTS

| 5,482,898 | A | * | 1/1996 | Marrs | 29/827 |
|---|---|---|---|---|---|
| 5,627,106 | A | * | 5/1997 | Hsu | 438/459 |
| 6,313,517 | B1 | * | 11/2001 | Lauterbach et al. | 257/621 |
| 6,337,227 | B1 | | 1/2002 | Ball | |
| 6,703,704 | B1 | * | 3/2004 | Alcoe et al. | 257/688 |
| 6,713,856 | B2 | * | 3/2004 | Tsai et al. | 257/686 |
| 2003/0025184 | A1 | | 2/2003 | Morozumi | |
| 2004/0056346 | A1 | * | 3/2004 | Palm et al. | 257/706 |

FOREIGN PATENT DOCUMENTS

| JP | 5041478 | 2/1993 |
|---|---|---|
| JP | 2000-252411 | 9/2000 |
| JP | 2001-044357 | 2/2001 |
| JP | 2001-094039 | 4/2001 |
| JP | 2001-244404 | 9/2001 |
| JP | 2001-326326 | 11/2001 |
| JP | 2003-51569 | 2/2003 |

OTHER PUBLICATIONS

Patent Office of the People's Republic of China, First Office Action of Sep. 7, 2007.

* cited by examiner

*Primary Examiner*—Hung Vu
(74) *Attorney, Agent, or Firm*—Staas & Halsey LLP

(57) ABSTRACT

A plurality of semiconductor packages is collectively fabricated on a wafer in a batch process and the wafer is then diced to obtain discrete semiconductor packages. The semiconductor package is a stacked body formed by bonding two or more semiconductor devices. Each semiconductor device comprises a substrate and a device pattern formed on a surface of the substrate. The semiconductor devices are stacked in such a fashion that a device pattern surface of the lower semiconductor device faces a non-device pattern surface of the semiconductor device stacked on the same.

15 Claims, 9 Drawing Sheets

SEMICONDUCTOR PACKAGE

BACKGROUND OF THE INVENTION

1. Field of the Invention

This invention relates to a semiconductor package having semiconductor devices packaged onto a substrate. More particularly, the invention relates to a small and high-performance semiconductor package capable of high-density packaging or a so-called "CSP (chip size package)". The invention further relates to a method of producing such a semiconductor package easily, and at a high yield, at a wafer level.

2. Description of Related Art

To cope with the higher performance and the reduction in size, so-called, "down sizing", of electronic appliances, various types of semiconductor packages have been proposed, in recent years, which combine semiconductor devices such as IC chips, LSI chips, etc, or semiconductor devices having semiconductor chips mounted onto a substrate. To accomplish high-density packaging in such a semiconductor package, various research institutes and companies have proposed models of three-dimensional packaging. Though a method that superposes semiconductor chips with one another and connects them through bonding wires has been proposed, the most promising method may be the one that the superposed semiconductor chips are bonded with one another, through flip chips (FC) and an under-fill material is filled between the chips.

Figure 1:
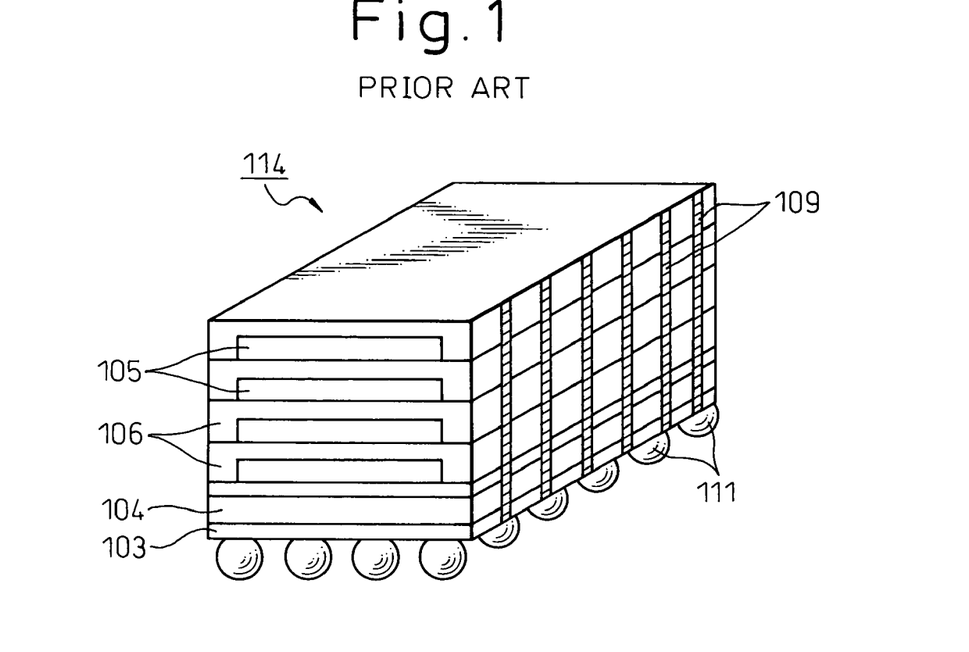
FIG. 1 is a perspective view showing an example of the semiconductor package according to the prior art.

Recently, a down-sized semiconductor package having no FC has been proposed. As shown in FIG. 1, for example, a stacked semiconductor device 114 fabricated by stacking a plurality of wafers (semiconductor chips) 105 on a pattern film 104 through an insulating adhesive 006 has been proposed (see, Japanese Unexamined Patent Publication (Kokai) No. 2000-252411). In this stacked semiconductor device 114, a longitudinal wiring pattern 116 is formed on outer and inner peripheries of the stacked body of the wafers 105 and external connection terminals 111 are arranged on the lower surface of the pattern film 105 through an external connection pattern 103. In the case of this stacked semiconductor device, however, stacking of the wafers, dicing, silicon etching and application of the insulating adhesive must be repeatedly carried out to form a stacked body having a plurality and desired number of stages of wafers, and the production steps are extremely complicated. Another problem is that the formation step of the longitudinal wiring pattern must be included separately.

Figure 2:
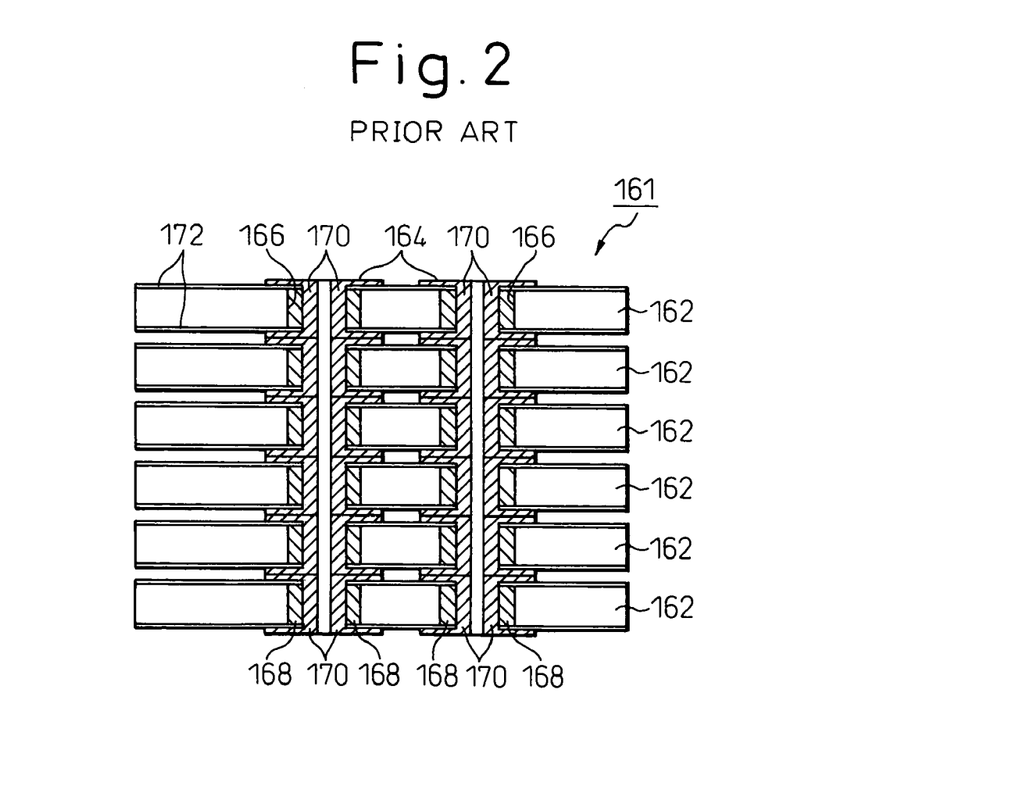
FIG. 2 is a perspective view showing another example of the semiconductor package according to the prior art.

A semiconductor device 161 fabricated by first producing semiconductor chips 162 having protrusive electrodes 164 on opposite surfaces thereof and stacking a plurality (six, in the drawing) of semiconductor chips 162 in such a fashion as to butt against one another as shown in FIG. 2 has also been proposed (see, Japanese Unexamined Patent Publication (Kokai) No. 2001-94039). Each semiconductor chip 162 has an insulating layer 172 on each surface thereof and a through-hole 166 formed between its opposite surfaces. An insulating film 168 and a conductor member 170 are serially formed inside the through-hole 166. However, because this semiconductor device employs the method that serially stacks the semiconductor chips, it has the drawback that the production yield is low. Further, the transfer step for the insulating layer, using a mold, is complicated.

SUMMARY OF THE INVENTION

It is an object of the invention to solve problems, of the prior art, such as those described above.

It is another object of the invention to provide a small or down-sized and high-performance semiconductor package capable of high-density packaging.

It is still another object of the invention to provide a method of producing a small and high-performance semiconductor package capable of high-density packaging, easily and with a high production yield, at a wafer level.

These and other objects of the invention will be easily understood from the following detailed explanation.

According to one aspect of the invention, there is provided a semiconductor package obtained by collectively fabricating a plurality of semiconductor packages on a wafer in a batch process and dicing it into discrete semiconductor packages, wherein the semiconductor package is a stacked body formed by bonding two or more semiconductor devices through an insulating layer; each of the semiconductor devices comprises a substrate and a device pattern formed on a surface of the substrate; and a device pattern surface of a lower semiconductor device faces a non-device pattern surface of a semiconductor device stacked on the lower semiconductor device.

According to another aspect of the invention, there is provided a method of producing a semiconductor package comprising a stacked body of two or more semiconductor devices each having a substrate and a device pattern formed on a surface of the substrate, comprising the steps of:

processing a wafer comprising a semiconductor material to collectively fabricate a plurality of semiconductor devices having a predetermined device pattern on a surface thereof in a batch process to thereby produce a semiconductor device-packaged wafer and repeating the production of the semiconductor device-packaged wafer;

bonding another semiconductor device-packaged wafer onto a lower semiconductor device-packaged wafer through an insulating layer with a non-device pattern surface of another semiconductor device-packaged wafer facing downward, wherein in a step of producing another semiconductor device-packaged wafer, a wafer comprising the semiconductor material is bonded onto the device pattern surface of the lower semiconductor device-packaged wafer, and the bonded wafer is fabricated to collectively fabricate a plurality of semiconductor devices having a predetermined device pattern on a surface thereof; and after bonding of a required number of semiconductor device-packaged wafers necessary for completing the semiconductor package is completed, dicing the resulting wafer stacked body along a predetermined dicing line to obtain discrete semiconductor packages from the wafer stacked body.

DESCRIPTION OF THE PREFERRED EMBODIMENTS

A semiconductor package and its production method according to the invention can be advantageously carried out in various embodiments. Preferred embodiments of the invention will be explained hereinafter.

The semiconductor package according to the invention is produced by collectively fabricating a plurality of semiconductor packages at a wafer level, i.e., on a wafer in a batch process, and dicing the wafer product so obtained into discrete semiconductor packages. In other words, the semiconductor package according to the invention is different in its construction and its production method from semiconductor packages that have widely been used in the past, that is, the semiconductor packages that are fabricated by producing in advance two or more semiconductor devices (semiconductor chips such as IC, LSI, etc, for example), followed by stacking the semiconductor devices and filling an under-fill material between the semiconductor devices. As will be easily understood from the following explanation, the feature of the invention that three-dimensional packaging, that can be done, particularly, at a wafer level, is advantageous in high-density packaging and in reducing the number of fabrication steps.

The semiconductor package according to the invention satisfies the following requirements.

(1) The semiconductor package is a stacked body obtained by bonding two or more semiconductor devices through an insulting layer in which an insulating layer is inserted between the adjoining semiconductor devices;

(2) Each semiconductor device comprises a substrate and device pattern formed on a surface of the substrate; and (3) The device pattern surface of a lower semiconductor device faces a non-device pattern surface of a semiconductor device stacked on the lower semiconductor device.

The semiconductor package is a stacked body obtained by bonding two or more semiconductor devices through insulating layers. However, the semiconductor device is not fabricated by bonding a required number of semiconductor devices already fabricated but is produced by conducting formation of a device pattern and bonding wafers to one another through insulating layers in a required number of wafers to obtain a wafer stacked body (a stacked body of wafers having semiconductor devices mounted thereto) and dicing the stacked body into discrete semiconductor packages.

In the practice of the invention, the number of stacked wafers that are used as the substrate of the resulting semiconductor devices is not particularly limited and a necessary number of wafers can be arbitrarily stacked in accordance with the construction of the desired semiconductor packages. The number of wafers to be stacked is generally about 2 to 8 and is preferably 4. Though the wafer can be formed of various materials, a semiconductor material such as silicon is generally preferred as the substrate. A ceramic material such as glass can also be used as the substrate, whenever necessary. The thickness of the wafer is generally within the range of about 50 to 725 μm.

In the semiconductor package according to the invention, an insulating layer is used for bonding the semiconductor devices (or wafers) to one another. The insulating layer is preferably formed from an insulating resin material and a polyimide resin and an epoxy resin, for example, are useful as the insulating layer material. To form the insulating layer, a solution of such a resin material may be applied and hardened. If necessary, the insulating layer may be formed by using an adhesive or an adhesive film. The thickness of the insulating layer is generally within the range of about 10 to 75 μm and is preferably within the range of about 10 to 45 μm.

In the semiconductor package according to the invention, each of the two or more semiconductor devices contained in the semiconductor package is constituted in such a fashion as to include a substrate and a device pattern formed on a surface of the substrate. The semiconductor device may comprise other elements, whenever necessary. The substrate is diced from the semiconductor wafer or other wafers, as described above, and the device pattern is formed on one of the surfaces of the substrate. The "device pattern" includes, but is not restricted to, wiring layers (inclusive of re-wiring layers, etc), electrodes, substrate through-electrodes, conductor pads, active chips and passive chips. The device pattern is generally formed on the surface of the substrate but may be formed on the back surface, or inside, of the substrate, whenever necessary.

In the semiconductor package according to the invention, the device pattern surface of the lower semiconductor device faces the back surface of the semiconductor device stacked on the lower semiconductor device. In other words, the semiconductor package according to the invention does not employ a construction in which the surface sides (device pattern surfaces) of the wafers are butted against one another and bonded but, instead, employs the construction in which the surface side of the wafer (device pattern surface) and the back surface of the wafer (the non-device pattern surface of the wafer, that is, the BSG side to which back surface polishing can be applied, whenever necessary) are butted against and bonded to one another. It is noted that according to the prior art technologies, such wafer-level three-dimensional packaging is very difficult. Such a bonding construction is useful for reducing the thickness of the semiconductor package, the wiring length and the number of production steps.

In addition, the semiconductor package according to the invention may have additional layer or layers to improve its construction and performance. For example, the non-device pattern surface of the lowermost semiconductor device in the semiconductor package according to the invention preferably further has a heat radiation or heat releasing layer formed of a material having a high heat transfer rate. The heat radiation layer corresponds to a cooling plate, a heat radiation fin, etc, that has been bonded separately in a conventional semiconductor package, and improves the heat radiation property of the semiconductor device. The heat radiation layer can also act as a support for the semiconductor device depending on its thickness.

The heat radiation layer is preferably deposited on the non-device pattern surface of the wafer as the lowermost layer before the semiconductor packages are individually diced. The heat radiation layer is preferably formed by using a thin film formation technology such as sputtering or vacuum deposition. In other words, as the heat radiation layer according to the invention can be formed as a thin film in the wafer level, it can greatly contribute to the reduction of the thickness of the semiconductor package and the number of production steps.

The heat radiation layer can be formed from various materials at any desired thickness. For example, when sputtering is used for forming films, copper, aluminum or an alloy thereof is suitable as the material of the heat radiation layer, though they are not restrictive. The thickness of the heat radiation layer is generally within the range of about 0.1 to 1 μm and is preferably within the range of about 0.1 to 0.5 μm.

The heat radiation layer can be formed in an arbitrary stage during the production of the semiconductor package in the wafer level according to the present invention and can be formed most usefully in the final stage of the production process on the BSG side of the wafer. The operation and effect contemplated by the invention can also be obtained when the heat radiation layer is formed on the BSG side in the wafer stage during the production of semiconductor devices and semiconductor packages not having the stacked construction, whenever necessary.

In the semiconductor package according to the invention, and preferably in the stacked semiconductor devices, the device patterns are electrically connected to one another through a wiring layer formed simultaneously in one semiconductor device, preferably through a re-wiring layer and a substrate through-electrode, i.e., electrode formed through the substrate. In other words, in the semiconductor package according to the invention, when the re-wiring layer and the substrate through-electrode are preferably formed simultaneously, the construction can be simplified and the number of production steps can be reduced. Each of the re-wiring layer and the substrate through-electrode can be advantageously formed by a plating of copper or an alloy thereof.

Further, in the semiconductor package according to the invention, the semiconductor device as the uppermost layer preferably further comprises a resin sealing layer on its device pattern surface. The resin sealing layer is preferably formed on the device pattern surface of the wafer as the uppermost layer before the semiconductor packages are discretely diced in the same way as the heat radiation layer described above. The resin used for forming the resin sealing layer is not particularly limited and an epoxy resin which is a conventional sealing resin can be used advantageously. The sealing resin can be applied to the device pattern surface by coating, potting, film bonding, and so forth. The resin sealing layer is useful for protecting the semiconductor package and its device pattern from the invasion of moisture and from impact. The thickness of the resin sealing layer is generally within the range of about 50 to 90 μm and is preferably within the range of about 60 to 80 μm.

Further, the invention resides in a production method of a semiconductor package comprising a stacked body of two or more semiconductor devices each comprising a substrate and a device pattern formed on the surface of the substrate. As will be understood from the above-mentioned explanation of the semiconductor package and from the following explanation of the embodiments with reference to the drawings, the production method according to the invention comprises the following steps:

(1) processing a wafer of a semiconductor material to collectively fabricate a plurality of semiconductor devices each having a predetermined device pattern on the surface of the wafer in a batch process to thereby form a semiconductor device-packaged wafer and repeating the formation of the semiconductor device-packaged wafer;

(2) bonding another semiconductor device-packed wafer on a lower semiconductor device-packaged wafer with its non-device pattern surface facing downward through an insulating layer wherein, in a step of producing another semiconductor device-packaged wafer, a wafer formed of a semiconductor material is bonded on a device pattern surface of the lower semiconductor-packaged wafer through the insulating layer, and the bonded wafer is fabricated to collectively fabricate a plurality of semiconductor devices each having a predetermined device pattern on its surface; and (3) after bonding of a necessary number of the semiconductor device-packaged wafers necessary for completing the semiconductor package is completed, the semiconductor packages are diced along a predetermined cutting line from the resulting wafer stacked body.

Note herein that the term "semiconductor device-packaged wafer" means a precursor of the semiconductor package according to the invention and designates one wafer in which a number of semiconductor devices corresponding to a number of semiconductor packages to be diced have already been fabricated. In other words, when a predetermined number of semiconductor-packaged wafers are stacked to obtain a wafer-stacked body and the wafer-stacked body is diced in accordance with a predetermined design, a desired number of semiconductor packages can be discretely obtained.

EXAMPLES

Next, examples of the invention will be explained with reference to the accompanying drawings. Note, however, that the invention is not limited to the following examples. In the following explanation of the production method of the semiconductor package, one semiconductor package is shown in magnification for the purpose of simplification of the explanation. In practice, however, as the production is performed in the wafer level, the production method that collectively and batchwise fabricates a large number of semiconductor packages into one wafer and dices the wafer into discrete semiconductor packages, is used.

Figure 3:
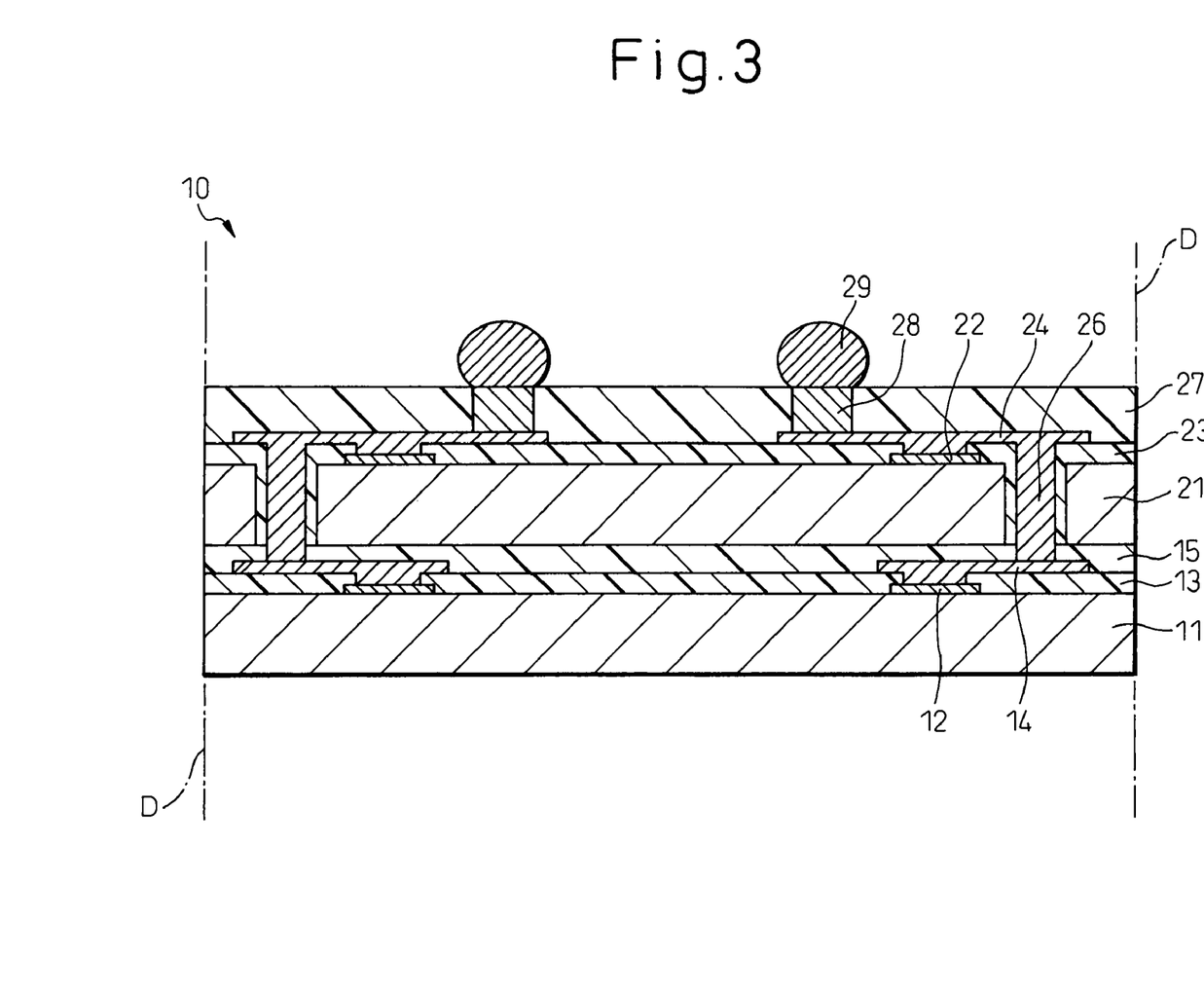
FIG. 3 is a sectional view showing the semiconductor package according to a preferred embodiment of the invention.

FIG. 3 is a sectional view showing a preferred example of the semiconductor package according to the invention. The semiconductor package 10 is produced by fabricating a large number of semiconductor devices into a silicon wafer in accordance with a predetermined design and dicing the wafer along a dicing line "D". In the illustrated semiconductor package 10, a first semiconductor device having a lower silicon substrate 11 and a second semiconductor device having an upper silicon substrate 21 are bonded to each other through an insulating layer 15 formed of an epoxy resin.

Referring to the first semiconductor device, a surface of a silicon substrate 11 corresponds to the "device pattern surface" referred to in the invention and the silicon substrate 11 includes an electrode pad 12 formed of aluminum (Al), a protective film 13 formed of a polyimide resin and a wiring layer (here, a re-wiring layer) 14 formed of copper (Cu). The back surface of the silicon substrate 11 is a back-surface-ground surface (BSG surface) and is already ground with a chemical mechanical polishing (CMP) to obtain a silicon substrate 11 having a desired thickness.

Next, referring to the second semiconductor device that is stacked in such a fashion that its BSG surface faces the device pattern surface of the first semiconductor device, a surface of a silicon substrate 21 corresponds to the device pattern surface. The silicon substrate 21 includes an electrode pad 22 formed of aluminum (Al), a protective film 23 formed of a polyimide resin and a wiring layer (here, a re-wiring layer) 24 formed of copper (Cu). The silicon substrate 21 has a substrate through-electrode 26 formed of copper (Cu) and penetrating through the silicon substrate 21. The substrate through-electrode 26 is formed simultaneously with the wiring layer 24 and electrically connects the wiring layer 24 and the wiring layer 14. The entire surface of the device pattern surface of the silicon substrate 21 is covered with a resin sealing layer 27 of an epoxy resin. Conductor posts 28 formed of copper (Cu) are implanted at predetermined positions on the wiring layer 24 and solder balls 29 are further put on the wiring layer 24. The solder balls 29 constitute external connection terminals and solder bumps, or the like, may be used in place of the solder balls 29.

The illustrated semiconductor package has the features in that the device pattern surface of the wafer and the BSG surface of the wafer are butted against each other in the bonding step of the wafers, that the substrate through-electrodes, i.e., via electrodes, are formed in such a fashion as to penetrate through the silicon substrate, that the wiring layer and the via electrode are simultaneously formed without using CMP, and that the wafer is diced to collectively obtain a large number of semiconductor packages. Owing to these features, the wiring length between the chips can be reduced and high-speed packages can be provided. Furthermore, high-density packaging becomes possible due to the three-dimensional construction.

Figure 4:
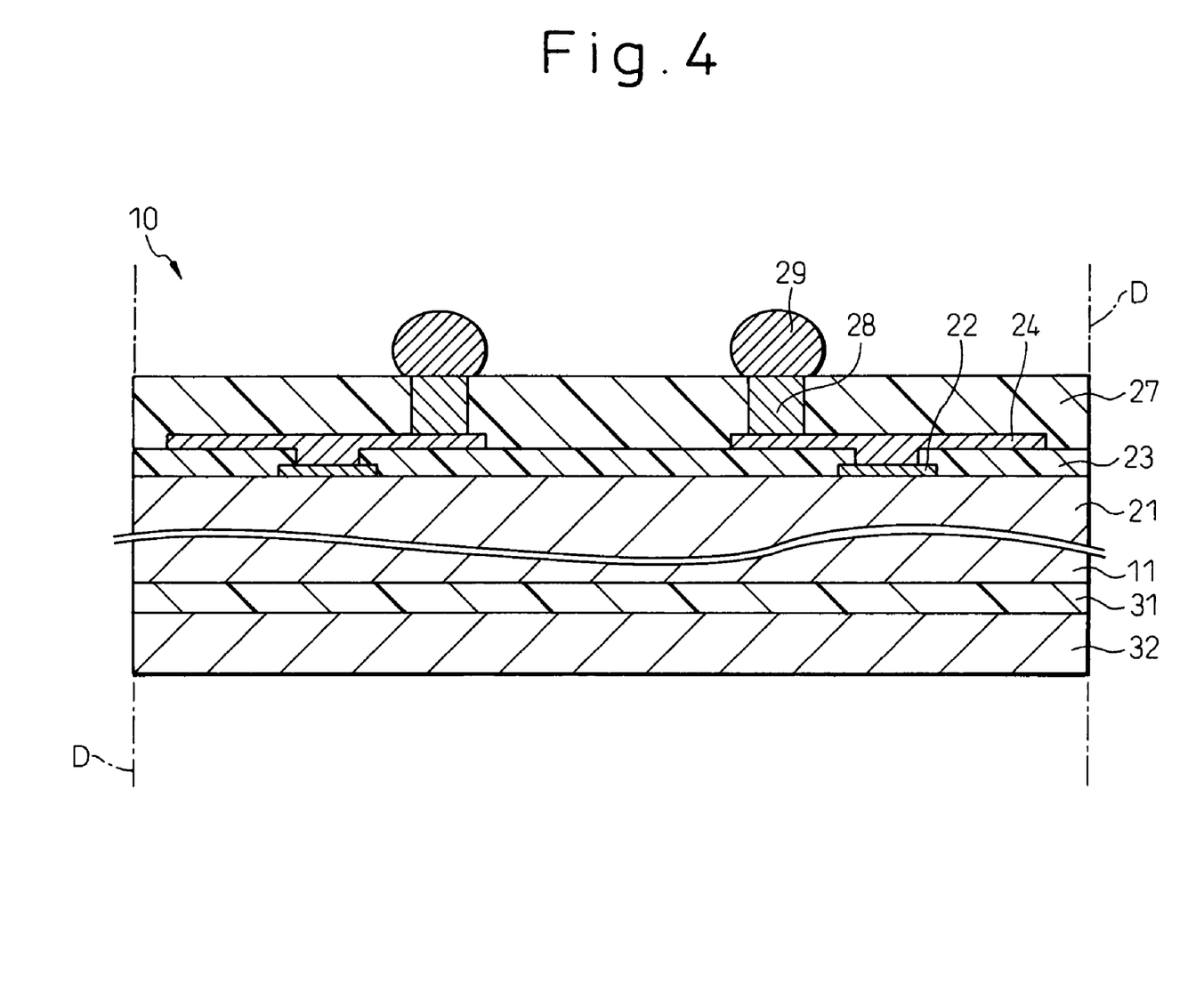
FIG. 4 is a sectional view showing the semiconductor package according to another preferred embodiment of the invention.

FIG. 4 is a sectional view showing an example where a cooling plate function is provided to the back surface of the wafer in the semiconductor package according to the invention. The semiconductor package 10 is obtained by dicing the stacked body of the semiconductor device-packaged wafers along the dicing line "D" in the same way as the semiconductor package shown in FIG. 3. In the illustrated semiconductor package 10, the first semiconductor device having the lower silicon substrate 11 and the second semiconductor device having the upper silicon substrate 21 are bonded through the insulating layer 15 formed of the epoxy resin.

As to the first semiconductor device, the details of its construction are omitted to simplify the explanation. The back surface of the silicon substrate 11 is polished by CMP to obtain a silicon substrate having a desired thickness and a back surface protective film 31 is bonded by bonding an epoxy resin film. A heat radiation layer 32 formed by sputtering aluminum (Al) is further stacked on the back surface protective film 31.

The second semiconductor device is stacked in such a fashion that its BSG surface faces the device pattern surface of the first semiconductor device. The silicon substrate 21 of the second semiconductor device corresponds to the device pattern surface and the second semiconductor device has the electrode pads 22 formed of aluminum (Al), the protective film 23 formed of the polyimide resin and the wiring layer (here, re-wiring layer) 24 formed of copper (Cu). The entire device pattern surface of the silicon substrate 21 is covered with the resin sealing layer 27 formed of the epoxy resin. The conductor posts 28 formed of copper (Cu) are implanted at predetermined positions on the wiring layer 24 and the solder balls 29 are further mounted. The solder balls 29 constitute the external connection terminal, and solder bumps, or the like, may be mounted in place of the solder balls 29.

The illustrated semiconductor package has features in that the device pattern surface of the wafer and the BSG surface of the wafer are butted against each other in the bonding step of the wafers, that the heat radiation layer is constituted from the material having a high heat transfer rate and is used as a support, and that the wafers inclusive of the support are diced to collectively obtain a large number of semiconductor packages. Owing to these features, the wiring length between the chips can be reduced and high-speed packages can be provided. Furthermore, high-density packaging becomes possible due to the three-dimensional construction. In addition to these features inherent to the semiconductor package according to the invention, the semiconductor package provides the new effects that the heat radiation property of the chip can be improved and that the number of production steps can be reduced because the heat radiation layer is formed, integrally with the wafer, in place of the cooling plate.

FIGS. 5A to 5J are sectional views showing, in sequence, a preferred production method of a semiconductor package having a construction similar to the construction shown in FIG. 3.

Figure 5A:
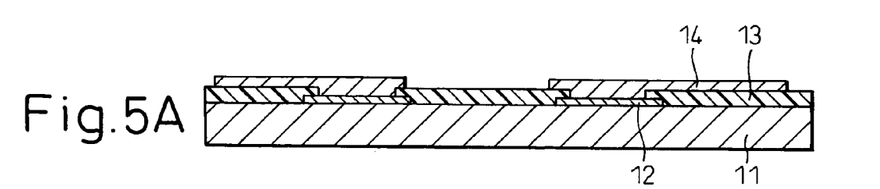
FIGS. 5A to 5J are sectional views showing, in sequence, a production method of the semiconductor package according to a preferred embodiment of the invention.

First, to fabricate a required number of semiconductor devices, a silicon wafer 11 shown in FIG. 5A is prepared. Incidentally, the drawing shows only a part (a portion corresponding to one semiconductor package; hence, a silicon substrate of the resulting semiconductor package) of the silicon wafer 11 to simplify the explanation, as already explained.

Next, the electrode pad 12 formed of aluminum (Al) is formed by plating and etching on the device pattern surface of the silicon wafer 11 so prepared and is covered with the insulating film 13 formed of the polyimide resin. The insulating film 13 can be formed by, for example, applying a precursor solution of the polyimide resin and curing the solution by heating. The portion of the electrode pad 12 in the insulating film 13 is left open to connect the wiring layer in the next step. Next, the wiring layer (here, a re-wiring layer) 14 is formed by plating copper (Cu) in a predetermined pattern.

Figure 5B:
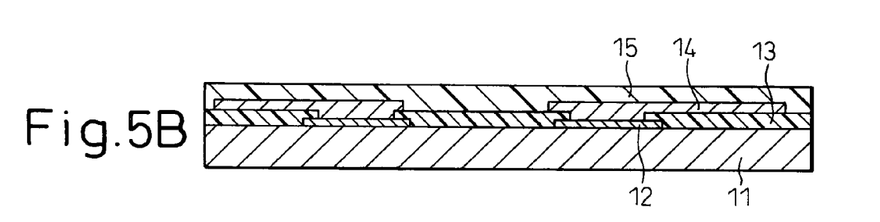

After the wiring layer 14 is formed, the epoxy resin is coated at a predetermined thickness on the device pattern surface of the silicon wafer 11 as shown in FIG. 5B to form the insulating layer 15. The insulating layer 15 may be formed by bonding an epoxy resin film, or may be formed of other materials so long as they are useful for mutually bonding the silicon wafers and provide the desired insulating effect.

Figure 5C:
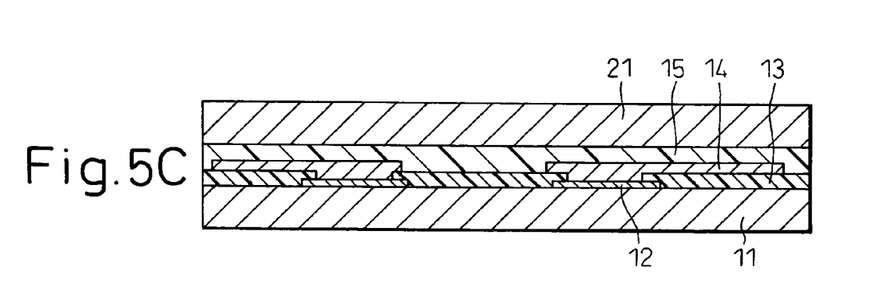

Next, as shown in FIG. 5C, the silicon wafer 21 is stacked on the silicon wafer 11 and is bonded through the insulating layer 15. The size of the silicon wafer 21 is the same as that of the silicon wafer 11.

Figure 5D:
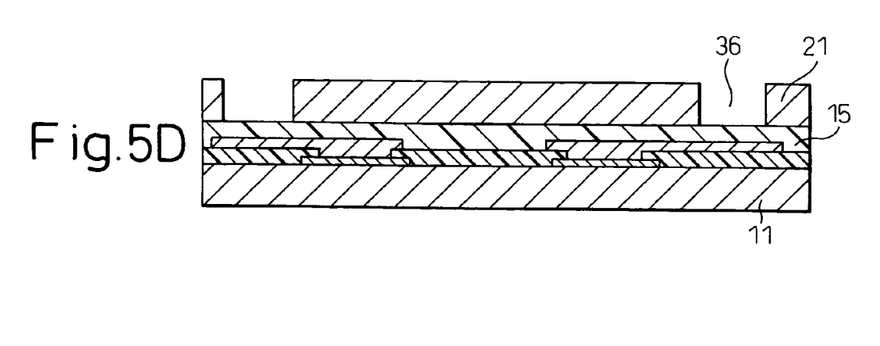

Subsequently, a required number of second semiconductor devices are fabricated into the silicon wafer 21 according to the following steps:

First, as shown in FIG. 5D, a through-hole 36 is formed at a substrate through-electrode (via-electrode) formation portion of the silicon wafer 21. The through-hole 36 can be formed by a conventional technique such as reactive ion etching (RIE), laser processing, etching, and so forth. As a result of the formation of the through-hole 36, the surface of the insulating layer 15 is partially exposed.

Figure 5E:
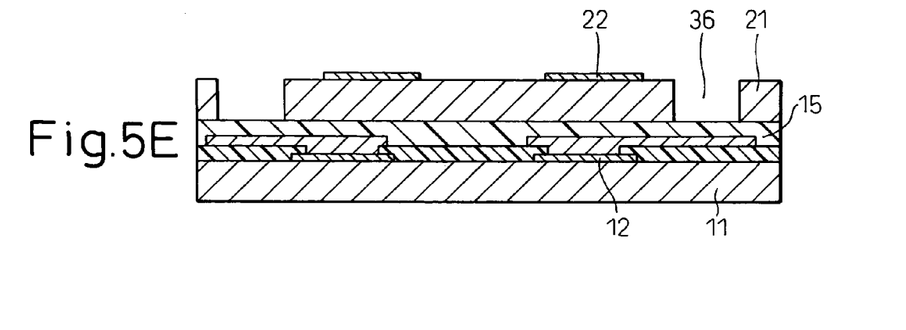

Next, as shown in FIG. 5E, the electrode pad 22 consisting of aluminum (Al) is formed by plating and etching on the device pattern surface of the silicon wafer 21.

Figure 5F:
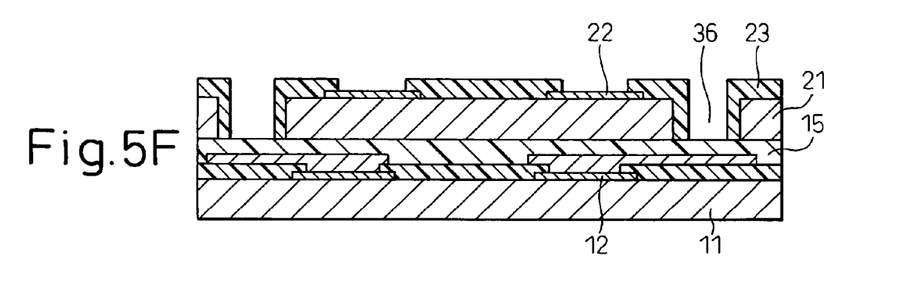

The silicon wafer 21 is thereafter covered with the insulating film 23 consisting of the polyimide resin as shown in FIG. 5F. The insulating film 23 is formed by, for example, applying a precursor solution of the polyimide resin and curing it by heating. In the insulating film 23, the portion of the electrode pad 22 is left open to connect the wiring layer in the next step. The sidewall of the through-hole 36 that has already been formed is also covered with the insulating film 23.

Figure 5G:
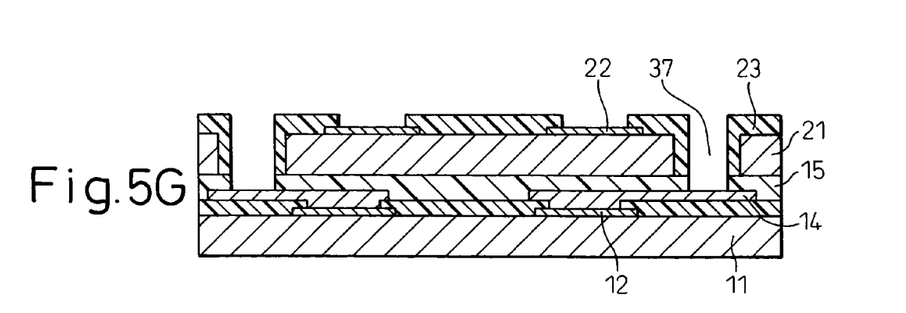

Subsequently, the insulating layer 15, exposed at the distal end of the through-hole 36, is selectively removed to form a deeper through-hole 37 to thereby expose the underlying wiring layer 14 as shown in FIG. 5G. This is to electrically connect the device pattern of the silicon wafer 11 to the device pattern of the silicon wafer 21 in the subsequent step. The removal or opening of the insulating layer can be carried out using a conventional technique such as wet etching, dry etching (chemical dry etching), laser processing, and so forth.

Figure 5H:
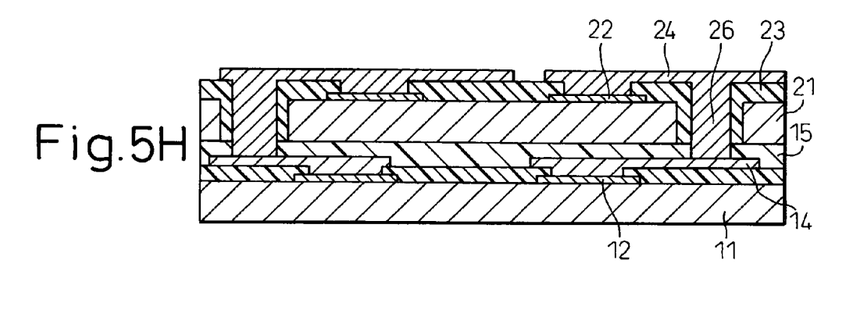

Thereafter, the wiring layer (here, a re-wiring layer) 24 consisting of copper (Cu) is formed at a predetermined pattern on the device pattern surface of the silicon substrate 21 as shown in FIG. 5H and at the same time, Cu is filled into the through-hole 37 formed in the preceding step to form the via electrode 26. Simultaneous formation of the wiring layer 24 and the via-electrode 26 can be carried out advantageously by electroplating or electroless plating of Cu, for example. Prior to this Cu plating step, a barrier metal layer and a seed layer are preferably formed from Cr, Ti, Cu, etc, by sputtering or the like.

Figure 5I:
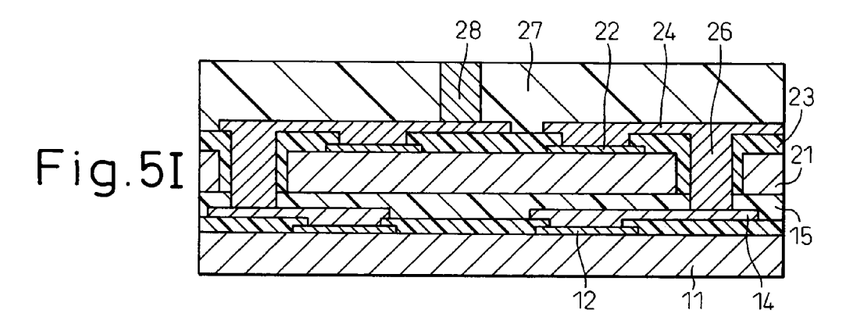

After the wiring layer 24 and the via electrode 26 are simultaneously formed in the silicon wafer 21 in the manner described above, the conductor (Cu) post 28 is formed as shown in FIG. 5I and the wafer 21 is covered as a whole with the epoxy resin to form the resin sealing layer 27. This step can be advantageously carried out by forming the Cu post 28 by electroplating of Cu with a resist pattern (not shown) as a mask, for example. After the seed layer is removed by etching, the epoxy resin is potted in accordance with the resin potting method to form the resin sealing layer 27.

Figure 5J:
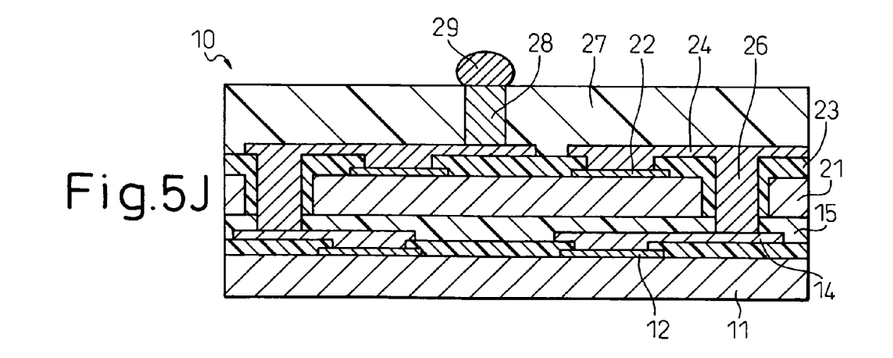

Finally, a solder ball 29 is put on the Cu post 28 formed in the preceding step and solder is caused to re-flow at an elevated temperature. Furthermore, after the silicon wafers 11 and 21 are diced along a predetermined dicing line (not shown), a large number of semiconductor packages 10 having the intended construction can be collectively acquired as shown in FIG. 5J.

FIGS. 6A to 6M are sectional views showing, in sequence, a preferred production method of semiconductor packages having a construction similar to the construction shown in FIG. 4.

Figure 6A:
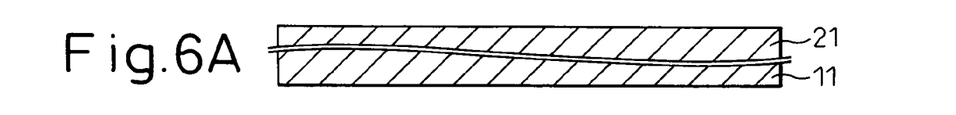
FIGS. 6A to 6M are sectional views showing, in sequence, a production method of the semiconductor package according to another preferred embodiment of the invention.

First, as shown in FIG. 6A the silicon wafer 21 is placed on the device pattern surface of the silicon wafer 11, having a predetermined number of first semiconductor devices (not shown) fabricated therein, in such a fashion that the BSG surface of the silicon wafer 21 faces the device pattern surface of the silicon wafer 11. The size of the silicon wafer 21 is the same as that of the silicon wafer 11. The BSG surface of the silicon wafer 21 is already polished by CMP to obtain the silicon wafer 21 having a desired thickness. The silicon wafer 11 and the silicon wafer 21 are bonded through the insulating layer (not shown) consisting of the epoxy resin.

Figure 6B:
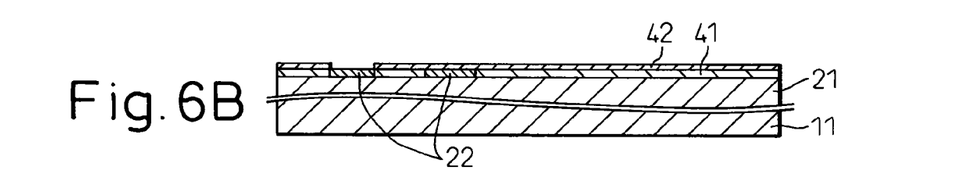

Next, pre-treatment for forming the wiring layer in a subsequent step is carried out as shown in FIG. 6B. First, the electrode pad 22 consisting of aluminum (Al) is formed by plating and etching on the device pattern surface of the silicon wafer 21. A passivation film 41 of polysilicate glass (PSG) and an insulating film of SiN are serially formed.

Figure 6C:
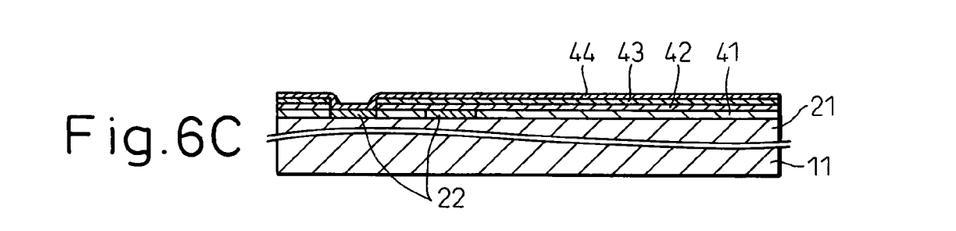

Subsequently, as shown in FIG. 6C, the barrier metal layer 43 and the seed layer (conductor layer) 44 are formed in this order. For example, the barrier metal layer 43 can be formed by sputtering Cr, Ti or the like and the seed layer 44 can be formed by sputtering Cu or the like.

After the pre-treatment is completed as described above, a formation step of the wiring layer (here, a re-wiring layer) is performed as follows.

Figure 6D:
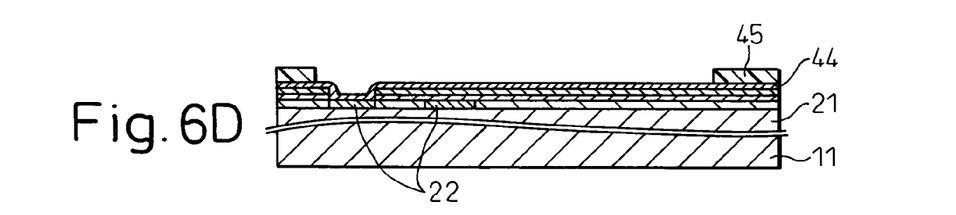

First, a guide resist film 45 is formed in such a fashion as to exclude the formation region of the re-wiring layer as shown in FIG. 6D. The guide resist film 45 can be formed by, for example, applying the resist to the entire surface of the silicon wafer 21, curing the resist and dissolving and removing unnecessary portions.

Figure 6E:
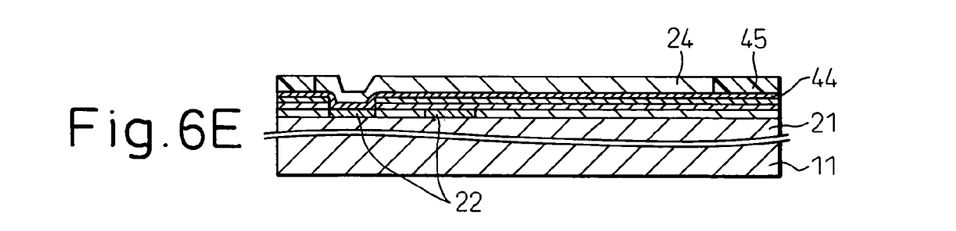
Figure 6F:
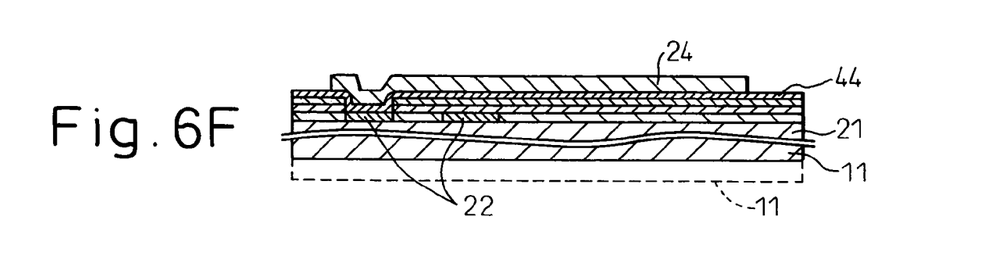

Next, plating of copper (Cu) is carried out in the presence of the guide resist film 45 to form the re-wiring layer of Cu on the device pattern surface of the silicon substrate 21 as shown in FIG. 6E. Cu plating can be carried out by electroplating and electroless plating of Cu, for example.

After the Cu re-wiring layer 24 is formed in the manner described above, as shown in FIG. 6F, the guide resist film 45 that has become unnecessary is dissolved and removed and the BSG surface of the silicon wafer 11 is ground by CMP. Portions indicated by a dotted line in the drawing are removed from the silicon wafer 11.

Figure 6G:
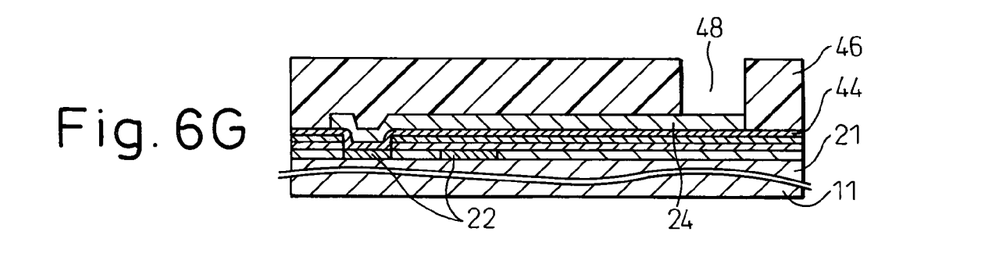

Next, as shown in FIG. 6G, a resist film 46 for a post formation guide is formed in regions other than the formation region 48 of the conductor post. This post formation guide resist film 46 is formed, for example, by applying the resist to the entire surface of the silicon wafer 21, curing the resist and dissolving and removing the resist from the region 48.

Figure 6H:
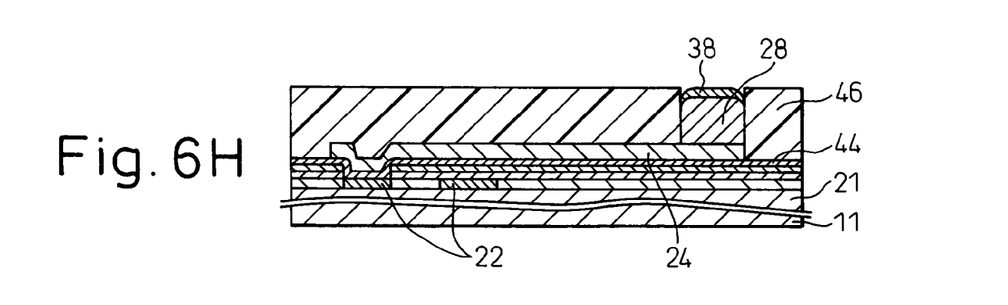

After the post formation guide resist film 46 is formed in the manner described above, the conductor (Cu) post 28 is formed and the barrier metal layer 38 is further formed on the Cu post 28 as shown in FIG. 6H. This step can be advantageously carried out by forming the Cu post 28 by electroplating of Cu in the presence of the resist film 45 as the mask, followed by sputtering the barrier metal (Cr, Ti, etc).

Figure 6I:
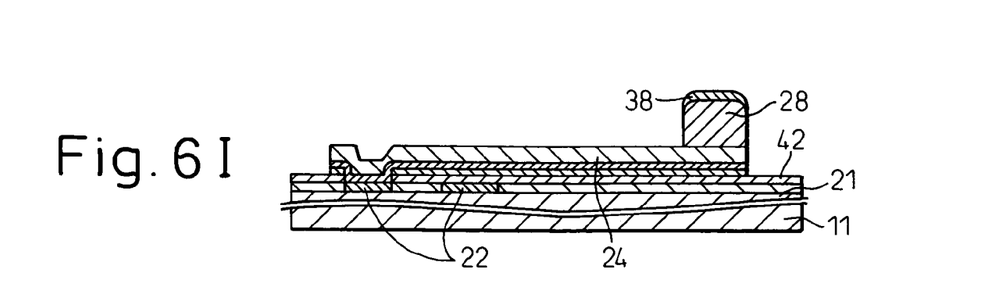

Next, the resist film 45 used as the mask for forming the Cu post 28 is dissolved and removed as shown in FIG. 6I. The barrier metal layer 43 and the seed layer 44 formed, on the silicon wafer 21, for plating are removed in this stage.

Figure 6J:
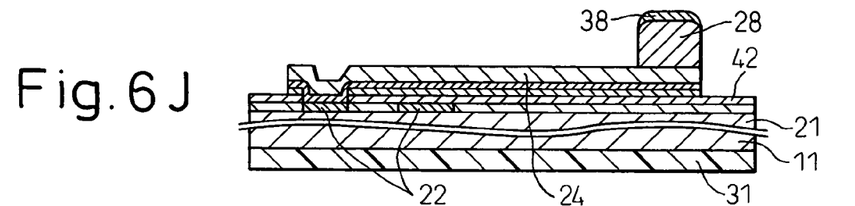

Subsequently, as shown in FIG. 6J, the epoxy resin film is bonded to the back surface of the stacked body of the silicon wafers 11 and 12 (BSG surface of the silicon wafer 11) to form the back surface protective film 31.

Figure 6K:
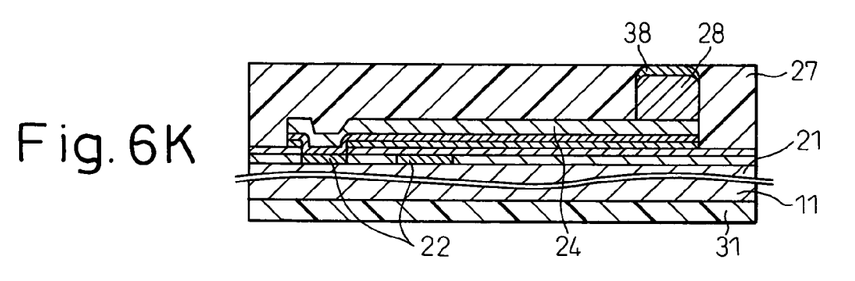

Thereafter, the epoxy resin is deposited to the device pattern surface of the resulting wafer stacked body at a thickness capable of completely burying the Cu post to form a resin sealing layer 27 as shown in FIG. 6K. The resin sealing layer 27 can be formed by potting the epoxy resin, for example.

Figure 6L:
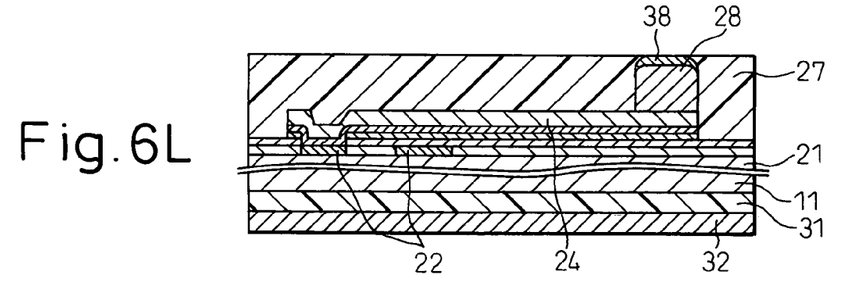
Figure 6M:
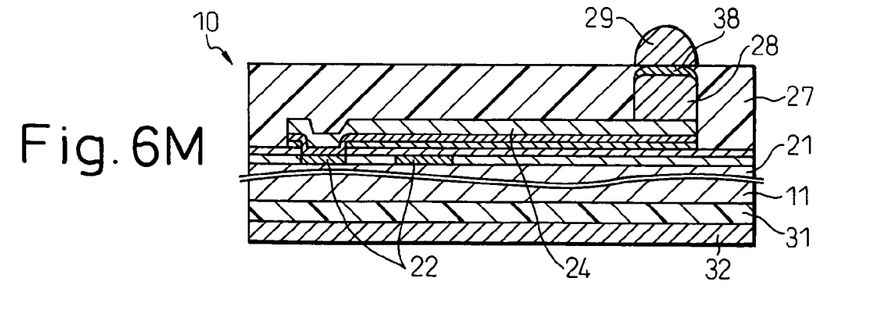

After resin sealing is complete, the heat radiation layer 32 is further formed on the back protective film 31 formed in the preceding step as shown in FIG. 6L. This step can be advantageously carried out by sputtering aluminum (Al) as a material having a high heat transfer rate, for example.

Finally, a solder ball 29 is put on the Cu post 28 formed in the preceding step and solder is caused to re-flow at an elevated temperature. Furthermore, the silicon wafers 11 and 21 are diced along a dicing line (not shown) to collectively produce a large number of semiconductor packages 10 having the intended construction shown in FIG. 6M.

As described above in detail, the present invention can provide a small and high-performance semiconductor package with high-density packaging and a method of producing such a semiconductor package easily and at a high yield in a wafer level. When a heat radiation layer consisting of a material having a high heat transfer rate and having a cooling plate function is formed on the back of the semiconductor package in the wafer level, the heat radiation performance of the semiconductor package can be improved and the number of production steps can be reduced in comparison with the case where the cooling plate is bonded as in the prior art.

It is particularly noteworthy that although wafer level three-dimensional packaging of the construction in which the surface side of the wafer (device pattern surface) and the back side of the wafer (BSG side as the non-device pattern surface) are butted against and bonded to one another has been believed difficult in the past, this invention can accomplish such a construction and can easily accomplish high-density packaging at the wafer level. When the means proposed in the invention is employed, there can be obtained the merit that existing materials for producing built-up substrates and an existing setup can be used, as such, for the invention.

According to the invention, packaging is done at the wafer level and the re-wiring layer is formed on the device pattern surface of the wafer. In the resulting semiconductor package, the wiring length between the semiconductor chip and the semiconductor chip can be shortened, and high-speed semiconductor packages, starting from semiconductor packages for radio frequency DRAM, can be accomplished.

According to the invention, further, when the re-wiring layer is formed on the device pattern surface of the wafer, CMP (chemical mechanical polishing) that has ordinarily been used prior to the formation of the re-wiring layer is not necessary and the via electrode can be formed simultaneously. Therefore, the production steps can be drastically reduced in number and simplified.

The invention claimed is:

1. A semiconductor package comprising:
   a layered stack of two or more semiconductor devices, wherein each semiconductor device layer comprises:
      a substrate and a non-device pattern surface formed on one side of the substrate and a device pattern surface formed on an opposing side of the substrate;
      an insulator bonding layer interposed between the non-device pattern surface of one semiconductor device layer and the device pattern surface of an adjacent semiconductor device layer;
      an electrically insulating protective film bonded to the non-device pattern surface of the lowermost semiconductor device layer of the stack; and
      a heat radiation layer bonded to the electrically insulating protective film, wherein the heat radiation layer has a thickness from about 0.1 µm to about 1 µm.

2. The semiconductor package of claim 1, wherein the thickness of the heat radiation layer is from about 0.1 µm to about 0.5 µm and wherein the electrically insulating protective film is an epoxy resin.

3. The semiconductor package of claim 1, wherein the layered stack is a diced stack.

4. The semiconductor package of claim 1, wherein the heat radiation layer comprises Cu, Al or an alloy thereof.

5. The semiconductor package of claim 4, wherein the heat radiation layer comprises Cu or an alloy thereof.

6. The semiconductor package of claim 4, wherein the heat radiation layer consists essentially of Cu, Al or an alloy thereof.

7. The semiconductor package of claim 6, wherein the heat radiation layer consists essentially of Cu or an alloy thereof.

8. The semiconductor package of claim 6, wherein the heat radiation layer consists of Cu, Al or an alloy thereof.

9. The semiconductor package of claim 1, wherein the insulating protective film comprises a polyimide resin.

10. The semiconductor package of claim 1 further comprising:
    a resin sealing layer bonded on the device pattern surface of an uppermost semiconductor device layer.

11. The semiconductor package of claim 10, wherein the layered stack is diced.

12. The semiconductor package of claim 10, wherein the resin sealing layer has a thickness from about 50 µm to about 90 µm.

13. The semiconductor package of claim 10, wherein the resin sealing layer has a thickness from about 60 µm to about 80 µm.

14. The semiconductor package of claim 1, wherein each semiconductor device layer comprises an electrode pad formed as part of the device pattern surface of each layer and the electrode pads of successive semiconductor device layers are connected by a via electrode between the electrode pads.

15. The semiconductor package of claim 14, wherein the electrode pads and the via electrodes between them comprise Cu or an alloy thereof.

* * * * *